US008244967B2

United States Patent
Ishibashi

(10) Patent No.: US 8,244,967 B2
(45) Date of Patent: Aug. 14, 2012

(54) METHOD TO REWRITE FLASH MEMORY WITH EXCLUSIVELY ACTIVATED TWO BLOCKS AND OPTICAL TRANSCEIVER IMPLEMENTING CONTROLLER PERFORMING THE SAME

(75) Inventor: Hiroto Ishibashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 239 days.

(21) Appl. No.: 12/705,377

(22) Filed: Feb. 12, 2010

(65) Prior Publication Data

US 2010/0205358 A1 Aug. 12, 2010

(30) Foreign Application Priority Data

Feb. 12, 2009 (JP) .................. 2009-029773

(51) Int. Cl.
*G06F 12/00* (2006.01)
*G06F 12/02* (2006.01)
(52) U.S. Cl. ............... 711/103; 711/104; 711/E12.001; 711/E21.008

(58) Field of Classification Search ............... 711/103, 711/104, E12.001, E12.008
See application file for complete search history.

(56) References Cited

U.S. PATENT DOCUMENTS 5,963,970 A * 10/1999 Davis ................ 711/103
2010/0130247 A1 * 5/2010 Junge et al. .......... 455/550.1

FOREIGN PATENT DOCUMENTS

JP 8-171545 7/1996
JP 2008-191797 8/2008

* cited by examiner

*Primary Examiner* — Yong Choe
(74) *Attorney, Agent, or Firm* — Smith, Gambrell & Russell, LLP

(57) ABSTRACT

An effective algorithm for the CPU with a flash memory is disclosed to shorten a dead time to erase the flash memory and to write new data therein. The flash memory of the invention provides front and back blocks for the user data area. When the front block is filled, the back block is erased just after the front block is fully filled in advance to receive a new data next to be written.

4 Claims, 3 Drawing Sheets

METHOD TO REWRITE FLASH MEMORY WITH EXCLUSIVELY ACTIVATED TWO BLOCKS AND OPTICAL TRANSCEIVER IMPLEMENTING CONTROLLER PERFORMING THE SAME

BACKGROUND OF THE INVENTION

1. Field of the Invention

The present invention relates to an optical transceiver implemented with a micro-processor.

2. Related Prior Art

One type of an optical transceiver implements a controller that provides an electrically erasable and programmable read only memory (hereafter denoted as EEPROM) for users to write field data therein. A multi-source agreement regarding the SFP+ type optical transceiver has rules that the EEPROM with user rewritable area of 120 bytes is implemented. A Japanese Patent Application published as JP-H08-171545A has disclosed that the user rewritable EEPROM memory is realized by a flash memory integrated within a micro-controller unit (hereafter denoted as MCU) to reduce the number of components installed within the system.

The rewriting of such a flash memory is generally carried out by a block as one unit, while, the number of rewriting of the flash memory is often restricted by an inherent characteristic of the flash memory or by the specification of the system such as the SFP+ transceiver that installs a flash memory. Another Japanese Patent Application has disclosed to reduce the number of the writing or the erasing of the block in the flash memory by writing difference data in different blocks.

In the procedure that the difference data is written in the flash memory, a series of procedures to rearrange the rewritable area, to erase the flash memory and to write the rearranged data is necessary. Occasionally, it takes much time to complete these procedures and exceeds the standard time defined in the specification of the system such as the SFP+ optical transceiver. The SFP+ standard sets the execution time to rearrange the flash memory to be 40 mS, while, some microprocessors require a time to erase the flash memory implemented therein to be 36 mS and another time to write 120 bytes data to be 71 μs×120=8.52 mS, a total of 44.52 mS, which exceeds the time assigned to rearrange the flash memory in the SFP+ standard.

The preset application provides, in a system with a micro-controller implemented with a flash memory, a new algorithm to rearrange the data stored in the flash memory to shorten the process time thereof.

SUMMARY OF THE INVENTION

One aspect of the present invention relates to a method to use a flash memory that sequentially stores data and provides at least two blocks each exclusively taking an active mode and an inactive mode. The method of the invention has a feature that, when the active block is detected to be filled, the inactive block is erased before the data next to be stored is received, and after receiving the data next to be stored and storing then into the inactive block, the inactive block is changed to be active, while, the active block is changed to be inactive.

Each block may have an allocation for an area for base data, an area for active flag, an area for inactive flag, and a plurality of areas for difference data. When the areas for difference data in the active block is detected to be filled, the whole inactive block is erased before the data next to be stored is received. When the inactive block is firstly set by the user data, a replica data is created on the RAM by procedures of: (1) fetching the base data stored in the area for base data and all difference data stored in the areas for difference data from the currently active block into the RAM; (2) creating a new based data to be stored in the flash memory based on thus fetched base data, the plurality of difference data, and the data to be next stored; and (3) then, thus created replica data is transferred into the inactive block of the flash memory. Synchronizing with the transfer of the replica data, an inactive flag is set in the area for inactive flag in the currently active block to change the mode of the currently active block to be inactive.

The method according to the present invention may be preferably implemented in an optical transceiver following the standard of the SFP+ pluggable transceiver, in which the time to rewrite the flash memory is strictly restricted. Because the method according to the present invention, the erase of an inactive block of the flash memory is carried out synchronized with the detection of the no user data area in the active block before the reception of the next data to be stored, and when the data next to be stored is received, only the creating of the new base data is performed. That is, the present invention divides two processes of erasing block and writing data into the erased block, which are conventionally done at one time, into independently carried out processes.

BRIEF DESCRIPTION OF DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, preferred embodiments of the present invention will be described as referring to accompanying drawings. In the description of the figures, the same numeral or the symbol will refer to the same element without over lapping explanations.

Figure 1:
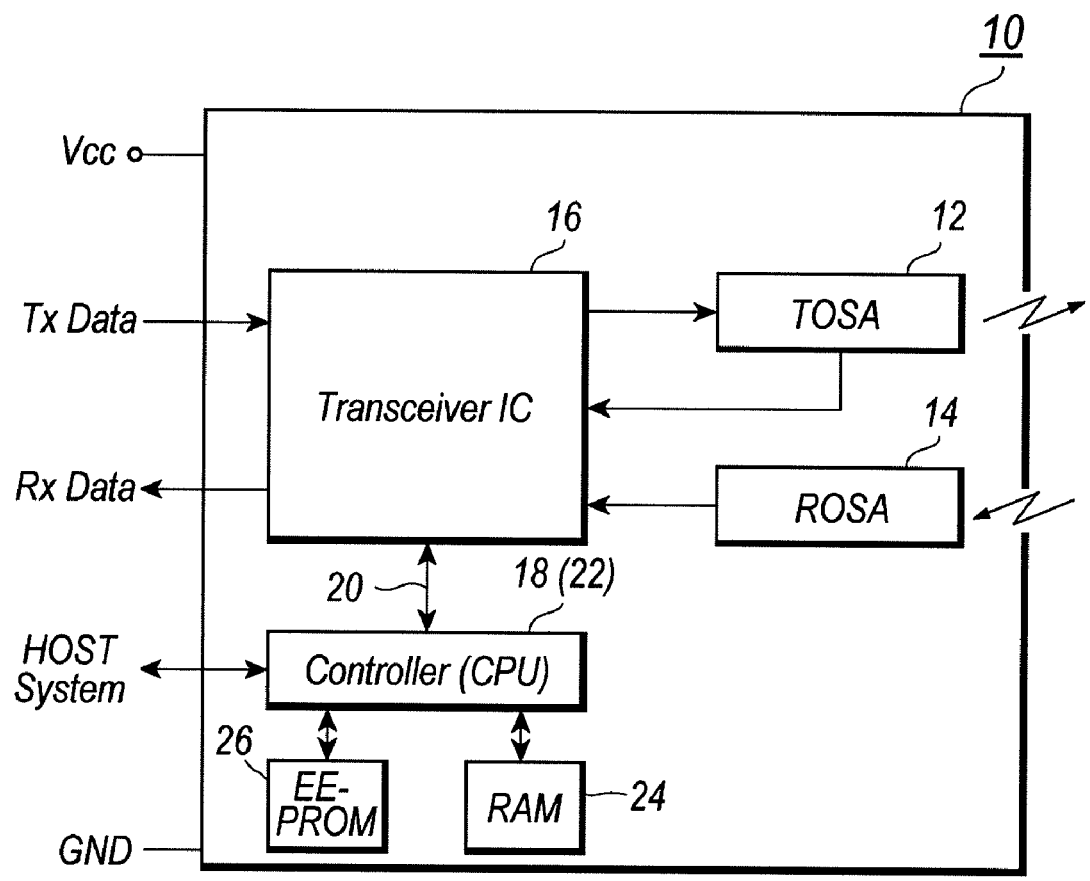
FIG. 1 is a block diagram of an optical transceiver according to an embodiment of the present invention where the controller includes a CPU, an EEPROM as a non-volatile memory and a RAM as a volatile memory.

FIG. 1 is a block diagram of an optical transceiver according to an embodiment of the present invention. The optical transceiver 10 shown in FIG. 1 comprises a transmitter optical subassembly (hereafter refereed as TOSA) 12, a receiver optical subassembly (hereafter referred as ROSA) 14, a transceiver IC 16 and a controller 18.

The TOSA 12 includes a semiconductor light-emitting device, typically a laser diode (LD), a light-receiving device such as photodiode (PD) to monitor a magnitude of the light emitted from the LD. The TOSA 12 emits signal light responding to a driving current provided from the transceiver IC 16. The driving current is modulated in the transceiver IC 16 by the Tx data, while, the magnitude thereof is controlled by a signal output from the PD installed within the TOSA 12. The ROSA 14 includes another PD to generate a photocurrent responding to the light provided from an external fiber coupled with the ROSA 14.

The transceiver IC 16 modulates the driving current, whose magnitude depends on the signal output from the PD in the TOSA 12 and signals provided from the controller 18 as mentioned above, based on the Tx data provided from the host device on which the transceiver 10 is installed. Further, the transceiver IC 16 outputs the Rx data, which reflects the optical signal received by the ROSA 14, to the host device. The transceiver IC 16 is coupled with the controller through the internal bus 20.

The controller 18 includes a central processing unit (CPU) 22, a type of volatile memory 24, which is often called as random access memory (RAM), and a type of non-volatile memory, typically a flash memory with a rewritable function 26. The non-volatile memory 26 may be a type of electrically erasable and programmable read only memory, which is often called as EEPROM. The CPU 22 operates according to a program stored in the EEPROM 26. The RAM 24 is for temporarily storing data therein. Reading and writing the data from/to the EEPROM 26 will be described later.

Figure 2:
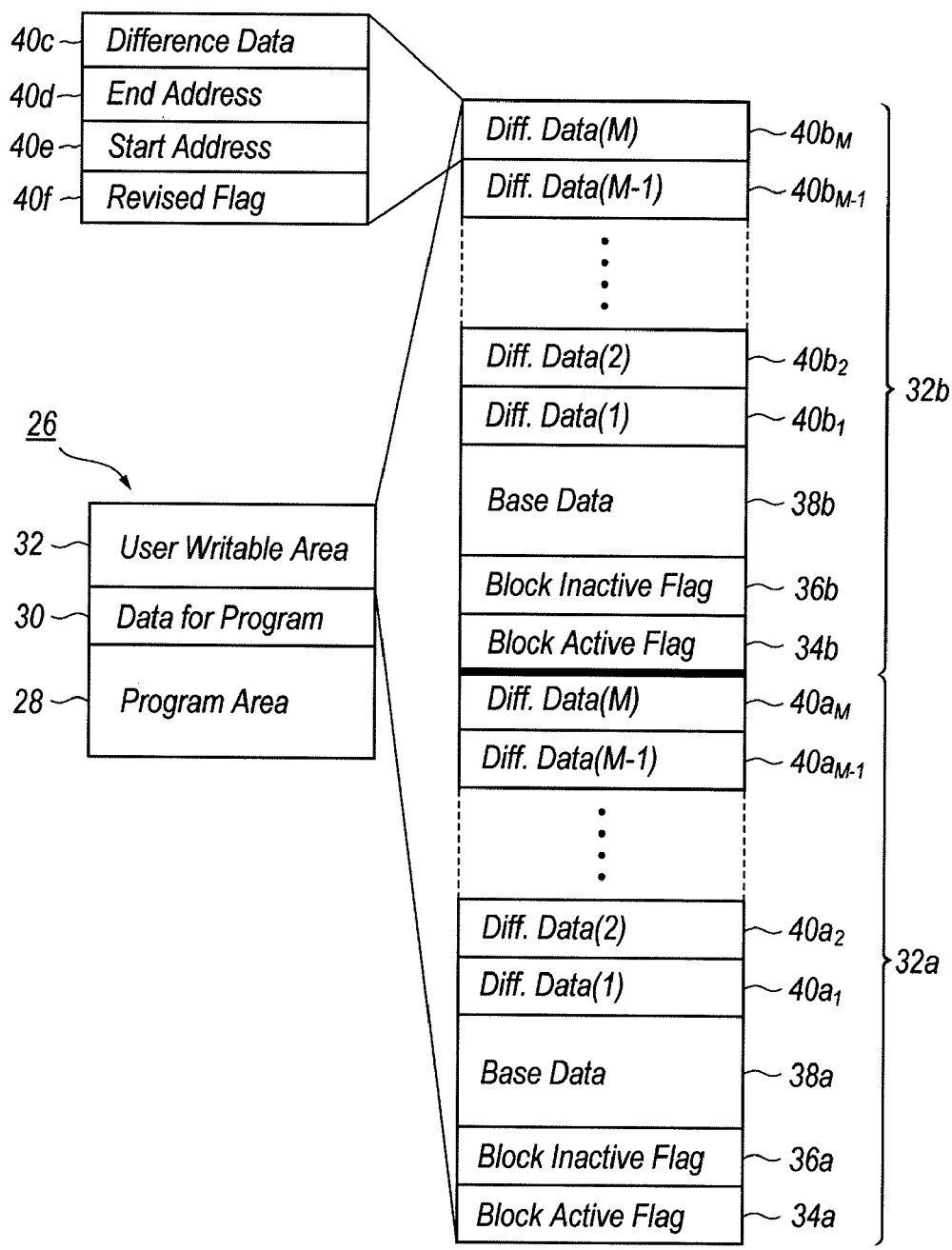
FIG. 2 shows a memory allocation map of in non-volatile memory shown in FIG. 1, where an user rewritable area is divided into the front block and the back block, each block includes a plurality of difference data areas, a base data area and flag areas.

FIG. 2 is a memory allocation map of the EEPROM shown in FIG. 1. The EEPROM 26 provides a program area 28, a data area 30 and a user area 32. The program area 28 stores the program to operate the CPU 22, while, the data area 30 stores parameters to be called from the program in the program area 28. As shown in FIG. 2, the user area 32 is divided into two blocks, that is, the front block 32*a* and the back block 32*b*. The size of the blocks depends on the minimum block size to be erased when the EEPROM is the type of the flash memory. The flash memory available in the market is ordinarily unable to overwrite data in an ordinary manner like that of a RAM, and is necessary to erase in the unit of the block in advance to rewrite data. The front block 32*a* and the back block 32*b* reflect the block size of the flash memory.

Each block, 32*a* and 32*b*, includes an area for the block active flag, 34*a* and 34*b*, an area for the block inactive flag, 36*a* and 36*b*, an area for the base data, 38*a* and 38*b*, and a plurality of areas for difference data, $40a_1$ to $40a_M$ and $40b_1$ to $40b_M$, where M is an integer greater than unity. These two blocks 32*a* and 32*b* are exclusively active, that is, when the front block 32*a* is active in reading/writing the data therefrom/thereto, the active flag is set in the area for the active flag 34*a*, while, the inactive flag is set in the area for the inactive flag in the back block 32*b*.

On the other hand, when the back block 32*b* is used for reading/writing the data therefrom/thereto, the area for the active flag in the back block 32*b* sets the active flag and the area for the inactive flag area in the front block 32*a* sets the inactive flag. Generally, when a flash memory is rewritten, that is, a new data is set in a memory cell, it is necessary to erase all cells including the target cell to be rewritten first; subsequently only the state "1" may be written into the target cell. Accordingly, it is unable to reset the active flag or the inactive flag reflecting the active mode of the blocks. Therefore, the inactive flag has the priority in the present embodiment of the non-volatile memory 26.

The areas for the base data, 38*a* and 38*b*, hold the base data; while, respective areas for the difference data, $40a_1$ to $40a_M$ and $40b_1$ to $40b_M$, store data that denotes a difference from those stored in respective areas for the base data, 38*a* and 38*b*. In an example, the data stored in the area for the base date, 38*a* or 38*b*, are the magnitude of the driving current for the LD and the maximum condition thereof, the preset optical power emitted from the LD and monitored by the PD in the TOSA 12, where the optical power depends on the magnitude of the driving current, or the threshold of the input optical power received by the ROSA 14, and so on.

FIG. 2 also shows a memory allocation map of respective areas, $40a_1$ to $40a_M$ and $40b_1$ to $40b_M$, for the difference data. The respective areas includes a difference data 40*c*, an end address 40*d*, a start address 40*e* and a flag 40*f* that denotes whether the data 40*c* is revised or not. In the embodiment shown in FIG. 2, respective areas for the difference data have the fixed length of 11 bytes, that is, 8 bytes for the difference data and 1 byte for other three parameters; however, the areas for the difference data may have a variable length.

Next, the reading/writing the data by the CPU 22 will be described. When the CPU 22 receives a request to read the data through an operating program or an interruption, the CPU reads the data stored in the area for the base data, 38*a* or 38*b*, and a series of the difference data stored in the areas for the difference data, $40a_1$ to $40a_M$ or $40b_1$ to $40b_M$, in the block whose active flag is set, and sets thus read data in the RAM 24. Next, the CPU 22 revises the base data by the series of the difference data and rewrites thus revised data in the RAM 24.

Figure 3:
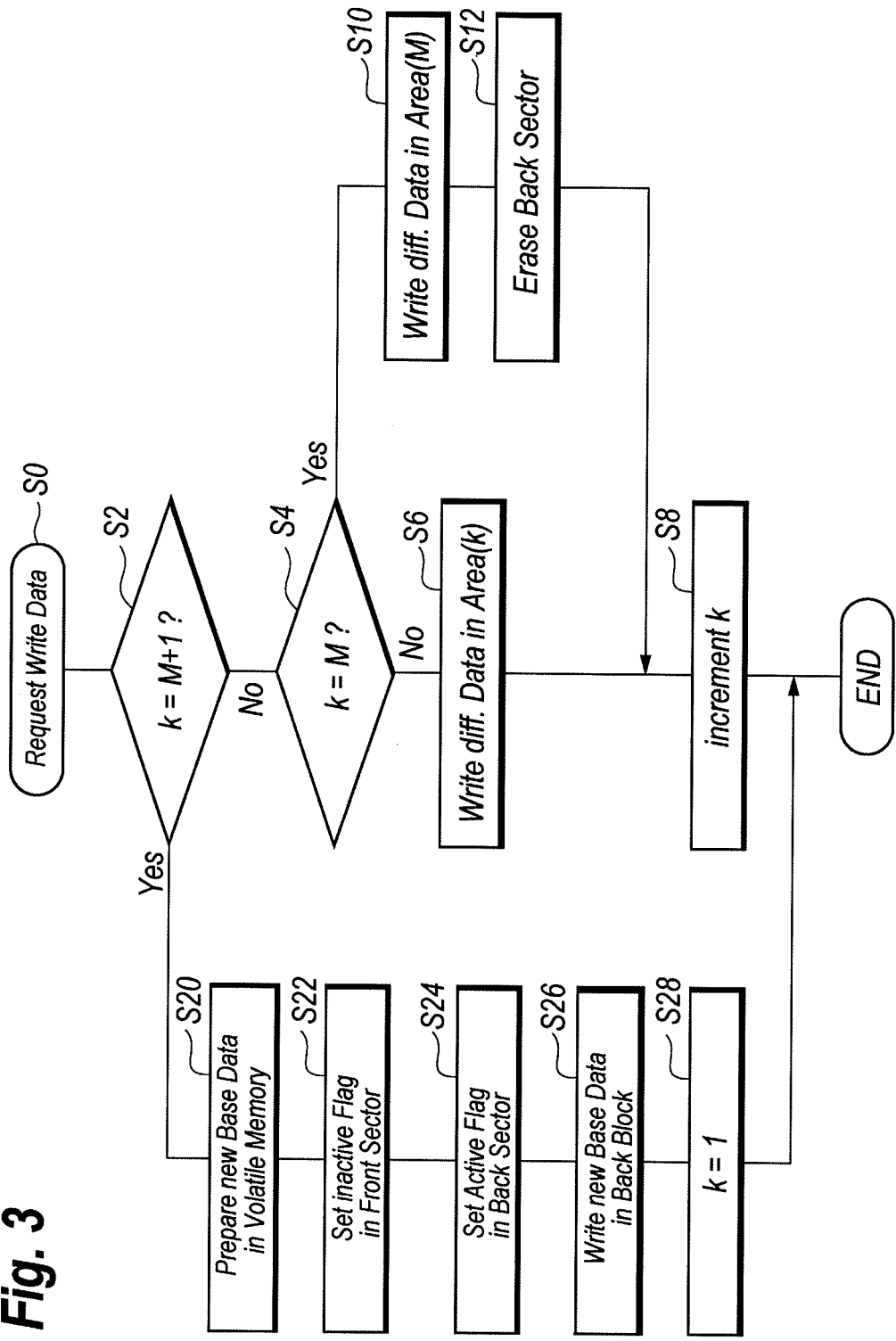
FIG. 3 shows a flow chart to write the difference data in the non-volatile memory.

Next, a procedure to write data will be described. FIG. 3 shows a flow chart for the procedure to write data in the non-volatile memory 26 performed by the CPU 22. The description below assumes a condition where the front block 32 is active and the area for the difference data stores data in order of their subscript. Further, an index k denotes the area to be written in the next event.

As shown in FIG. 3, a request to write data starts the write procedure of the CPU 22 (step S0). Asserting the write request, the CPU 22 receives a difference data from the host device. Next, the CPU 22 verifies whether more than two areas for the difference data are left in the areas, $40a_1$ to $40a_M$, in the front block 32*a*. Specifically, the CPU 22 checks in step S2 the index k equal to M+1 or not; and further checks in step S4 when the index k is not M+1 whether the index k is equal to M or not. When the index k is not equal to M, which means that the front block 32*a* leaves more than two areas for the difference data, the CPU 22 writes the difference data just received from the host device into the area $40a_k$ in step S6 and increases the index k by one (1) in step S8, that is, the new index becomes k+1.

When the index k is equal to M, that is, only one area $40a_M$ for the difference data is left in the front block 32*a*, the CPU 22 writes the difference data just received from the host device into the top area $40a_M$ at step S10. Then, the CPU 22 erases the whole back block 32*b* at step S12 and increases the index k by one, which means that the index k becomes M+1. Further, when the index k is equal to M+1 at step S2, which means that no areas for the difference data are left in the front block 32*a*, the CPU 22 rearranges the back block 32*b* at step S22. Specifically, the CPU 22 prepares in the RAM 24 the new base data by reading the current base data held in the area 38*a* in the front block 32*a*, all difference data stored in the areas $40a_1$ to $40a_M$ into the RAM 24, and creating the new base data by counting the series of difference data and currently received difference data with the original base data at step S20.

Then, the CPU 22 sets the inactive flag in the inactive flag area 36*a* of the front block 32*a*, step S22; while, set the active flag in the area 34*b* for the active flag at step S24. Because the inactive flag has the priority, the front block 32*a* becomes inactive even the active flag is set in the area for the active flag 34*a*. Then, the CPU 22 writes the new base data in the area 38*b* for the base data in the back block 32*b*, and sets the index k=1, step S28.

Thus, the procedures from step S20 to S28 omit the operation to erase the back block 32*b*, where the erasing of the back block 32*b* is carried out in advance at step S18 when the last area $40a_M$ for the difference data in the front block 32*a* is filled, which may shorten the time to write data in the non-volatile memory. For instance, assuming that step S10 that writes data in the top area $40a_M$ for the difference data carries out by a rate of 71 μs/byte for data with length of 11 bytes and step S12 to erase the whole back block 32b spends 36 mS, then, steps S10 to S12 spend 36.8 mS in total.

Further, assuming that each of the active flag and the inactive flag has a length of one byte, the area for the base data allocates 120 bytes, and the write time for the non-volatile memory is 71 μs/byte; steps S23 to S26 spend $(120+1+1)\times 71$ μS=8.7 mS. That is, steps S10 to S12 and steps S23 to S28 are each carried out within 40 mS, which satisfies the standard set for the SFP+ pluggable optical transceiver.

While there has been illustrated and described what are presently considered to be example embodiments of the present invention, it will be understood by those skilled in the art that various other modifications may be made, and equivalents may be substituted, without departing from the true scope of the invention. Many modifications may be made to adapt a particular situation to the teachings of the present invention without departing from the central inventive concept described herein.

For instance, Although the flow chart shown in FIG. 3 erases the inactive block of the flash memory after writing a new difference data in the last area for the difference data in the active area, however, the erase of the inactive block may be carried out in advance to write the new difference data. Therefore, it is intended that the present invention not be limited to the particular embodiments disclosed, but that the invention include all embodiments falling within the scope of the appended claims.

I claim:

1. A method to control an electronic apparatus that includes a central processing unit (CPU), a non-volatile electrically erasable and programmable read only memory (EEPROM), and a volatile random access memory (RAM), said non-volatile EEPROM including at least two blocks for storing user rewritable data, said two blocks being exclusively active under control by said CPU and each of said two blocks providing an area for base data, an area for flag data, and a plurality of areas each for difference data denoting a difference from said base data, said method comprising steps of:

erasing one of said blocks which is currently inactive when said CPU detects that another block which is currently active is to be filled with data which said CPU is going to write in said active block before said CPU receives next data to be written therein;

reading said base data from said area for base data and said difference data from said areas for difference data in said active block into said volatile RAM;

creating new base data in said volatile RAM based on said base data, said difference data, and said next data;

transferring said new base data created in said volatile RAM to said inactive block of said non-volatile EEPROM; and exchanging a mode of said blocks including a step to change said currently inactive block to be active and to change said currently active block to be inactive.

2. The method of claim 1,
wherein said method further includes steps of:
setting an active flag in said area for said active flag in said volatile RAM,
resetting an inactive flag in said area for said inactive flag in said volatile RAM, and
setting an inactive flag in said area for said inactive flag in said currently active block in said non-volatile EEPROM,
wherein said step to transfer said new base data includes a step to transfer said active flag and said inactive flag into said currently inactive block in said non-volatile EEPROM.

3. An optical transceiver communicating with a host device, comprising:
a transmitter optical subassembly (TOSA) for transmitting signal light to an optical fiber by receiving Tx data from said host device;
a receiver optical subassembly (ROSA) for providing an Rx data to said host device by receiving another signal light from another optical fiber;
a controller including a flash memory and a random access memory (RAM), said flash memory including two blocks each exclusively taking an active mode and an inactive mode for user data sent from said host device, each of said blocks allocating an area for base data, an area for an active flag, an area for an inactive flag and a plurality of areas each for difference data,
wherein, when said currently active block of said flash memory is detected to be filled with user data, said currently inactive block is erased before user data next to be stored in said flash memory is received, and
wherein said controller prepares in said RAM, replica data to be next stored in said flash memory based on base data stored in said area for base data, difference data stored in said areas for difference data each read from said active block, and said user data next to be stored in said flash memory, and transfers said replica data prepared in said RAM to said currently inactive block of said flash memory that was erased in advance of reception of said user data next to be stored.

4. The optical transceiver of claim 3,
wherein said replica data includes an active flag, and
wherein said controller sets an inactive flag in said area for an inactive flag in said active block of said flash memory synchronized with said writing said replica data into said inactive block of said flash memory.

* * * * *